US010014013B2

(12) United States Patent
Kryder et al.

(10) Patent No.: US 10,014,013 B2
(45) Date of Patent: Jul. 3, 2018

(54) L1₀-ORDERED MNAL THIN FILMS WITH HIGH PERPENDICULAR MAGNETIC ANISOTROPY, AND STRUCTURES AND DEVICES MADE THEREWITH

(71) Applicant: Carnegie Mellon University, Pittsburgh, PA (US)

(72) Inventors: Mark H. Kryder, Pittsburgh, PA (US); Efrem Y. Huang, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 15/515,380

(22) PCT Filed: Oct. 2, 2015

(86) PCT No.: PCT/US2015/053692
§ 371 (c)(1),
(2) Date: Mar. 29, 2017

(87) PCT Pub. No.: WO2016/054489
PCT Pub. Date: Apr. 7, 2016

(65) Prior Publication Data
US 2017/0221508 A1    Aug. 3, 2017

Related U.S. Application Data

(60) Provisional application No. 62/071,763, filed on Oct. 2, 2014.

(51) Int. Cl.
*H01L 29/82* (2006.01)
*G11B 5/39* (2006.01)
(Continued)

(52) U.S. Cl.
CPC .......... *G11B 5/3909* (2013.01); *G11B 5/1278* (2013.01); *G11C 11/161* (2013.01); *H01L 43/08* (2013.01); *H01L 43/10* (2013.01)

(58) Field of Classification Search
CPC ..... G11B 5/3909; G11B 5/1278; H01L 43/08; H01L 43/10; G11C 11/161
See application file for complete search history.

(56) References Cited

U.S. PATENT DOCUMENTS 7,494,725 B2   2/2009   Maeda et al.
8,824,108 B2   9/2014   Fuji et al.
(Continued)

OTHER PUBLICATIONS

International Search Report and Written Opinion dated Feb. 3, 2016, in connection with PCT/US15/53692.
(Continued)

*Primary Examiner* — Yosef Gebreyesus
(74) *Attorney, Agent, or Firm* — Downs Rachlin Martin PLLC (57) ABSTRACT

A stacked-thin-film structure that includes an Ll0-ordered MnAl layer having high perpendicular magnetic anisotropy (PMA). In some embodiments, the Ll0-ordered MnAl layer has an Mn content in a range of about 35% to about 65%, a thickness less than about 50 nm, a saturation magnetization of about 100 emu/cm3 to about 600 emu/cm3 and a magnetocrystalline anisotropy of at least 1×106 erg/cm. In some embodiments, the high-PMA Ll0-ordered MnAl material is incorporated in magnetic tunneling junction stacked-film structures that are part of magnetoelectronic circuitry, such as spin-transfer-torque magnetoresistive random access memory circuitry and magnetic logic circuitry. In some embodiments, the high-PMA Ll0-ordered MnAl material is incorporated into other devices, such as into read/write heads and/or recording media of hard-disk-drive devices.

46 Claims, 7 Drawing Sheets

(51) Int. Cl.
  *G11C 11/16*  (2006.01)
  *G11B 5/127*  (2006.01)
  *H01L 43/08*  (2006.01)
  *H01L 43/10*  (2006.01)

(56) References Cited

U.S. PATENT DOCUMENTS

| | | | |
|---|---|---|---|
| 2007/0096229 A1 | 5/2007 | Yoshikawa et al. | |
| 2011/0011733 A1 | 1/2011 | Yang et al. | |
| 2012/0241881 A1* | 9/2012 | Daibou | H01L 43/10 257/421 |
| 2013/0001714 A1* | 1/2013 | Nishiyama | G11C 11/16 257/421 |
| 2013/0307102 A1 | 11/2013 | Oh et al. | |

OTHER PUBLICATIONS

Yang et al., Structure and Magnetic Properties of L1o-FePt Thin Films on TiN/RuAl Underlayers; Journal of Applied Physics 109,07B770 (2011); pp. 1-3.

Nie et al., Perpendicularly Magnetized t-MnAl (001) Thin Films Epitaxied on GaAs; Applied Physics Letters 102, 152405 (2013), pp. 1-4.

Hosoda et al., Fabrication of L1o-MnAl Perpendicularly Magnetized Thin Films for Perpendicular Magnetic Tunnel Junctions; Journal of Applied Physics 111, 07A324 (2012); pp. 1-3.

Chen, W., Structural and Material Exploration of Magnetic Tunnel Junctions; http://libra.virginia.edu/catalog/libra-oa:4286; Sep. 29, 2015; pp. 1-162.

Li-Jun et al., Recent Progress in Perpendicularly Magnetized Mn-based Binary Alloy Films; State Key Laboratory of Superlattices and Microstructures; ArXiv: 1309.0298 (2013); pp. 1-14.

* cited by examiner

L1$_0$-ORDERED MNAL THIN FILMS WITH HIGH PERPENDICULAR MAGNETIC ANISOTROPY, AND STRUCTURES AND DEVICES MADE THEREWITH

RELATED APPLICATION DATA

This application claims the benefit of priority of U.S. Provisional Patent Application Ser. No. 62/071,763, filed on Oct. 2, 2014, and titled "L1$_0$-ordered MnAl thin films with high perpendicular magnetic anisotropy," which is incorporated by reference herein in its entirety.

FIELD OF THE INVENTION

The present invention generally relates to the field of MnAl thin films. In particular, the present invention is directed to L1$_0$-ordered MnAl thin films with high perpendicular magnetic anisotropy, and structures and devices made therewith.

BACKGROUND

Perpendicularly magnetized ferromagnetic thin films have applications in permanent magnets, hard disk drive (HDD) devices, nonvolatile memory technologies (e.g., STT-MRAM), sensors, and spintronic devices (e.g., magnetic logic), among others. Various materials, including manganese aluminum (MnAl), have been investigated over the years to determine whether they are suitable for producing thin films having magnetic properties, such as high perpendicular magnetic anisotropy (PMA), suitable for commercial applications. These investigations have revealed that thin MnAl films having L1$_0$-ordering (a/k/a the "τ-phase") appear promising for commercial applications. However, the τ-phase MnAl films achieved to date are not optimal for computing applications, such as HDDs, nonvolatile memory technologies, and spintronic devices, among others. In addition, while there has been considerable work developing τ-MnAl films on substrates such as GaAs (001), MgO (001), and glass since the material was discovered around 1960, there have been no reports of high-PMA τ-MnAl films on Si substrates in spite of the fact that there have been attempts to make them on Si substrates.

SUMMARY OF THE DISCLOSURE

In one embodiment, the present disclosure is directed to a stacked-film structure. The stacked-film structure includes a crystalline silicon substrate; one or more first underlayers formed on said crystalline silicon substrate; and an L1$_0$-ordered MnAl layer formed on said one or more first underlayers, said L1$_0$-ordered MnAl layer exhibiting perpendicular magnetic anisotropy and having: an Mn content in a range of about 50% to about 58%; a thickness less than about 50 nm; a saturation magnetization of about 100 emu/cm$^3$ to about 600 emu/cm$^3$; and a magnetocrystalline anisotropy of at least 1×10$^6$ erg/cm$^3$.

In another embodiment, the present disclosure is directed to a magnetic tunneling junction structure. The magnetic tunneling junction structure includes a crystalline silicon substrate; a first electrode/underlayer formed on said crystalline silicon substrate; a first magnetic layer formed on said first electrode/underlayer; a second magnetic layer; a tunnel barrier formed between said first magnetic layer and said second magnetic layer; and a second electrode layer formed on said second magnetic layer; wherein as least one of said first magnetic layer and said second magnetic layer comprises an L1$_0$-ordered MnAl layer exhibiting perpendicular magnetic anisotropy and includes an Mn content in a range of about 50% to about 58%; a thickness less than about 50 nm; a saturation magnetization of about 100 emu/cm$^3$ to about 600 emu/cm$^3$; and a magnetocrystalline anisotropy of at least 1×10$^6$ erg/cm$^3$.

In yet another embodiment, the present disclosure is directed to a computing device. The computing device includes a magnetic tunneling junction (MTJ)-based circuitry having an MTJ structure that includes a crystalline silicon substrate; a first electrode layer formed on said crystalline silicon substrate; a first magnetic layer formed on said first electrode/underlayer; a second magnetic layer; a tunnel barrier formed between said first magnetic layer and said second magnetic layer; and a second electrode layer formed on said second magnetic layer; wherein as least one of said first magnetic layer and said second magnetic layer comprises an L1$_0$-ordered MnAl layer exhibiting perpendicular magnetic anisotropy and having an Mn content in a range of about 50% to about 58%; a thickness less than about 50 nm; a saturation magnetization of about 100 emu/cm$^3$ to about 600 emu/cm$^3$; and a magnetocrystalline anisotropy of at least 1×10$^6$ erg/cm$^3$.

In yet another embodiment, the present disclosure is directed to a hard-disk-drive device. The hard-disk-drive device includes at least one platter rotatably mounted on a spindle and driven by a spindle motor; an actuator arm pivotably moved by an actuator, said actuator arm comprising at least one read/write head disposed proximate said at least one platter, said read/write head having a magnetic tunneling junction structure that includes a crystalline silicon substrate; a first electrode layer formed on said crystalline silicon substrate; a first magnetic layer formed on said first electrode/underlayer; a second magnetic layer; a tunnel barrier formed between said first magnetic layer and said second magnetic layer; and a second electrode layer formed on said second magnetic layer; wherein as least one of said first magnetic layer and said second magnetic layer comprises a first L10-ordered MnAl layer exhibiting perpendicular magnetic anisotropy and having a first Mn content in a range of about 50% to about 58%; a first thickness less than about 50 nm; a first saturation magnetization of about 100 emu/cm$^3$ to about 600 emu/cm$^3$; and a first magnetocrystalline anisotropy of at least 1×10$^6$ erg/cm$^3$.

In yet another embodiment, the present disclosure is directed to a hard-disk-drive device. The hard-disk-drive device includes at least one platter rotatably mounted on a spindle and driven by a spindle motor, said at least one platter including a recording medium that comprises an L1$_0$-ordered MnAl layer exhibiting perpendicular magnetic anisotropy and having an Mn content in a range of about 50% to about 58%; a thickness less than about 50 nm; a saturation magnetization of about 100 emu/cm$^3$ to about 600 emu/cm$^3$; and a magnetocrystalline anisotropy of at least 1×10$^6$ erg/cm$^3$; and an actuator arm pivotably moved by an actuator, said actuator arm comprising at least one read/write head disposed proximate said recording medium.

In yet another embodiment, the present disclosure is directed to a stacked-film structure. The stacked-film structure includes a substrate; one or more first underlayers formed on said substrate, said one or more first underlayers comprising an interface layer having an a-axis lattice constant in a range of about 3.8 Å to about 4.6 Å; and an L1$_0$-ordered MnAl layer formed on said interface layer, said L1$_0$-ordered MnAl layer exhibiting perpendicular magnetic anisotropy and having a coercivity in a range of 6 kOe to 40 kOe when said $L1_0$-ordered MnAl layer is unmodified; an Mn content in a range of about 50% to about 58%; a thickness less than about 50 nm; a saturation magnetization of about 100 emu/cm$^3$ to about 600 emu/cm$^3$; and a magnetocrystalline anisotropy of at least 1×10$^6$ erg/cm$^3$.

In yet another embodiment, the present disclosure is directed to a stacked-film structure. The stacked-film structure includes a substrate; a TiN underlayer formed on said substrate; and an $L1_0$-ordered MnAl layer formed on said TiN underlayer, said $L1_0$-ordered MnAl layer exhibiting perpendicular magnetic anisotropy and having a thickness less than about 50 nm.

In yet another embodiment, the present disclosure is directed to a hard-disk-drive device. The hard-disk-drive device includes at least one platter rotatably mounted on a spindle and driven by a spindle motor, said at least one platter including a recording medium that comprises the stacked-film structure of any of claims 50 to 58.

In yet another embodiment, the present disclosure is directed to a magnetic tunneling junction structure. The magnetic tunneling junction structure includes a substrate; a first electrode formed on said substrate; a first magnetic layer formed on said first electrode/underlayer; a second magnetic layer; a tunnel barrier formed between said first magnetic layer and said second magnetic layer; and a second electrode layer formed on said second magnetic layer; a TiN interface layer; and wherein as least one of said first magnetic layer and said second magnetic layer comprises an $L1^0$-ordered MnAl layer formed on said TiN interface layer, exhibiting perpendicular magnetic anisotropy, and having a thickness less than about 50 nm.

In yet another embodiment, the present disclosure is directed to a computing device. The computing devices includes a magnetic tunneling junction (MTJ)-based circuitry that includes the MTJ structure of any of claims 60 to 68.

In yet another embodiment, the present disclosure is directed to a hard-disk-drive device. The hard-disk-drive devices includes at least one platter rotatably mounted on a spindle and driven by a spindle motor; an actuator arm pivotably moved by an actuator, said actuator arm comprising at least one read/write head disposed proximate said at least one platter, said read/write head including the magnetic tunneling junction structure of any one of claims 60 to 68.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

In some aspects, the present invention is directed to creating stacked-film structures comprising one or more thin $L1_0$-ordered (or τ-phase) MnAl layers having high perpendicular magnetic anisotropy (PMA). Perpendicularly magnetized ferromagnetic thin films have applications in permanent magnets, hard disk drives (HDDs), nonvolatile memory technologies, spintronic devices, and sensors, among others. As those skilled in the art understand, $L1_0$-ordering of the MnAl in its τ-phase causes the MnAl to be highly ferromagnetic, whereas other phases of MnAl exhibit poor ferromagnetic properties. Thus, well-ordered τ-phase MnAl is needed to produce high-PMA thin films and functional devices. As noted in the Background section above, there is a lack of reporting by anyone before the present invention of successfully creating high-PMA τ-phase MnAl thin films having characteristics suitable for use in practical devices, especially on silicon substrates and which are compatible with complementary metallic oxide semiconductor (CMOS) processing techniques ubiquitous in the manufacturing of such devices. In some aspects, the present invention is directed to 1) such stacked-film structures, 2) processes of fabricating such stacked-film structures, and 3) devices that include such stacked-film structures. These and other aspects of the present invention are described and exemplified below in the context of specific examples.

Figure 1:
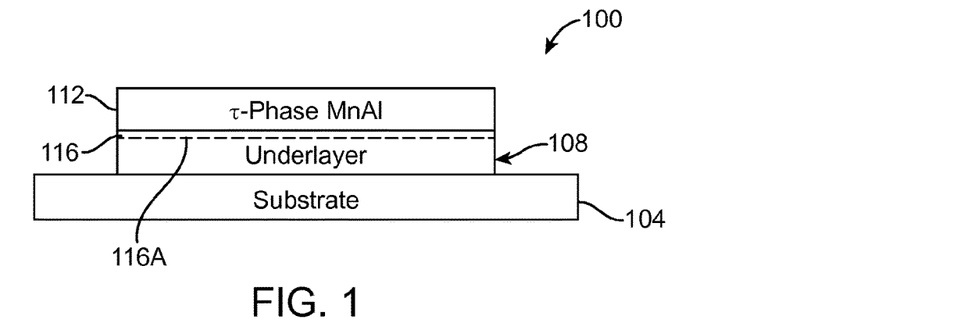
FIG. 1 is a diagram of an exemplary stacked-thin-film structure made in accordance with the present invention.

Referring now to the drawings, FIG. 1 illustrates an exemplary stacked-film structure 100 made in accordance with aspects of the present invention. In this example, stacked-film structure 100 comprises a substrate 104, an underlayer 108 applied to the substrate, and a high-PMA τ-phase MnAl layer 112 applied to the underlayer. As those skilled in the art understand, materials demonstrating a high PMA have anisotropy fields, $H_K$, greater than the demagnetization field, $H_D$. As those skilled in the art also understand, $H_K$ is a function of the magnetocrystalline anisotropy, $K_U$, and the saturation magnetization, $M_S$. In some examples, τ-phase MnAl layer 112 has an $M_S$ in the range of about 100 emu/cm$^3$ to 600 emu/cm$^3$ and a corresponding $K_U$ of at least $1 \times 10^6$ erg/cm$^3$. In some embodiments, $K_U$ may be a value up to $2 \times 10^7$ erg/cm$^3$ In some embodiments, the coercivity $H_C$ of τ-phase MnAl layer 112 is a range of 6 kOe to 40 kOe, though coercivity can be tuned to lower values of coercivity as needed for a particular application It is noted that these values of coercivity $H_C$ are for an unmodified layer of τ-phase MnAl, i.e., a layer of τ-phase MnAl that has not been post-processed to change the external physical character of the layer, such as by texturing, creating islands, etc. As discussed below, in some examples the present inventors have achieved a coercivity $H_C$ in fabricated τ-phase MnAl layers equal to or greater than 6 kOe using underlayers having a lattice constant in a range of about 3.92 Å to about 4.5 Å. These coercivities can be achieved, for example, in τ-phase MnAl layers formed on TiN, and especially on TiN formed on a crystalline silicon substrate, such as a (100) silicon substrate. Regarding lattice parameters of τ-phase MnAl layer 112 itself, in some embodiments it is desirable that the a-axis lattice constant be in a range of about 3.8 Å to about 4.2 Å, with the a-axis lattice constant being close to 3.92 Å. Correspondingly, the c-axis lattice constant be in a range of about 3.2 Å to about 3.7 Å, with the c-axis lattice constant being close to 3.59 Å

In addition, the present inventors have noted that achieving $L1_0$-ordering in a very thin deposited MnAl layer, such as a layer having a thicknesses of 50 nm or less, appears to be highly dependent on the composition of the MnAl film. For example, it appears that the proportion of Mn and Al in a well-ordered τ-phase MnAl film should not vary too much from 50-50. Indeed, the proportion of Mn in the MnAl composition of τ-phase MnAl layer 112 should be within a range of about 50% to about 58% In some embodiments, the proportion of Mn in the MnAl composition of τ-phase MnAl layer 112 is in a range of about 52% to about 56%. Regarding the thickness of τ-phase MnAl layer 112, in some embodiments the thickness is desired to be no more than about 40 nm, while in other embodiments, the thickness is desired to be no more than about 20 nm, while in still other embodiments, the thickness is desired to be less than about 5 nm, depending on the application at issue. τ-phase MnAl layer 112 may be applied to underlayer 108 using any suitable technique, such as sputtering, chemical vapor deposition, molecular beam epitaxy, and ion beam deposition, among others.

Substrate 104 may be any suitable substrate that is compatible with the growth of underlayer(s) 108 that itself/themselves is/are selected and configured, at least in part, to support growth of high-quality τ-phase MnAl within τ-phase MnAl layer 112. In one embodiment, substrate 104 is a crystalline silicon substrate, such as a (100) silicon substrate. Depending on the use of τ-phase MnAl layer 112, substrate 104 may or may not be processed, prior to the formation of underlayer 108, to contain any number and type of electronic devices and/or components that contribute to the functionality of the device(s) or structure(s) containing the τ-phase MnAl layer. As noted elsewhere herein, the ability of substrate 104 to be a crystalline silicon substrate is highly desirable in that stacked-film structure 100 may then be fabricated using ubiquitous complementary metallic oxide semiconductor (CMOS) processing techniques, i.e., without the need to use specialized substrates and corresponding less-common fabrication techniques and processes. While a crystalline silicon is a particularly useful material for substrate 104, it is not necessarily the only substrate material that can be used for producing high-quality, high-PMA first τ-phase MnAl layer 112. Examples of other substrate materials include, but are not limited to, GaAs (with or without an AlAs buffer), Cr-buffered MgO (001), and glass.

Underlayer 108 may be composed of one or more sublayers, with the layer on which τ-phase MnAl layer 112 is deposited being denoted herein as the "interface layer" 116 as it interfaces directly with the layer containing the τ-phase MnAl material. Dashed line 116A denotes a boundary between interface layer 116 and another sublayer of underlayer 108 when the underlayer is composed of two or more sublayers. When underlayer 108 is a single layer, interface layer 116 is one and the same with the underlayer. Interface layer 116 can be selected to be either a conductive layer, such as when basic stacked-film structure 100 is part of a magnetic tunneling junction (MTJ) structure (e.g., such as in MTJ stacked-film structure 200 of FIG. 2 described in detail below) or an insulating layer, depending on the application at issue.

Referring still to basic stacked-film structure 100 of FIG. 1, and particularly to interface layer 116 of underlayer 108, in some embodiments and as noted above it is desirable that the interface layer have a lattice constant in a range of about 3.8 Å to about 4.6 Å. In some embodiments, it can be desirable to form τ-phase MnAl layer 112 on a material having a lattice constant somewhat greater than the a-axis lattice constant of bulk τ-phase MnAl of 3.92 Å to provide good lattice matching for epitaxial growth and to promote the proper orientation of the crystal lattice so that the anisotropy is perpendicular and not in-plane. Examples of layers suitable for interface layer 116 of underlayer 108 include, but are not limited to, MgO, TiN, Ta, Cr, CrRu, and $(Mg_{0.2}Ti_{0.8})O$. The MgO and TiN underlayers reported herein were found to have a-axis lattice constants of 4.2 Å and 4.3 Å, respectively. The thickness of underlayer 108 may be a suitable thickness, such as about 50 nm or less. As noted above, the present inventors have found thin τ-phase MnAl films formed on TiN to have particularly well-ordered crystalline structures that allow them to achieve excellent magnetic properties, such as coercivities $H_C$ of 6.0 kOe and greater and magnetocrystalline anisotropy of $1 \times 10^7$ erg/cm$^3$ and greater, at thicknesses of about 50 nm or less. Interface layer 116 may be applied over substrate 104 using any suitable technique, such as sputtering, chemical vapor deposition, molecular beam epitaxy, and ion beam deposition, among others.

The present inventors have found that a number of factors can be important to achieving high-quality high PMA thin τ-phase MnAl films, including the following factors. The binding energy between interface layer 116 and the Mn and Al atoms has effects on film nucleation and growth morphology leading to changes in the MnAl grain size and film roughness. During high temperature depositions of films, underlayer material(s) may diffuse into the MnAl films and thereby alter magnetic properties of the MnAl films. For certain applications, such as STT-MRAM, CMOS-compatibility is important. For certain applications, such as STT-MRAM, electrical conductivity is important. Generally, conductive materials can be deposited using DC sputtering, which is significantly faster and easier to control compared to RF sputtering. For certain applications, such as heat-assisted magnetic recording media, thermal conductivity is important.

Figure 2:
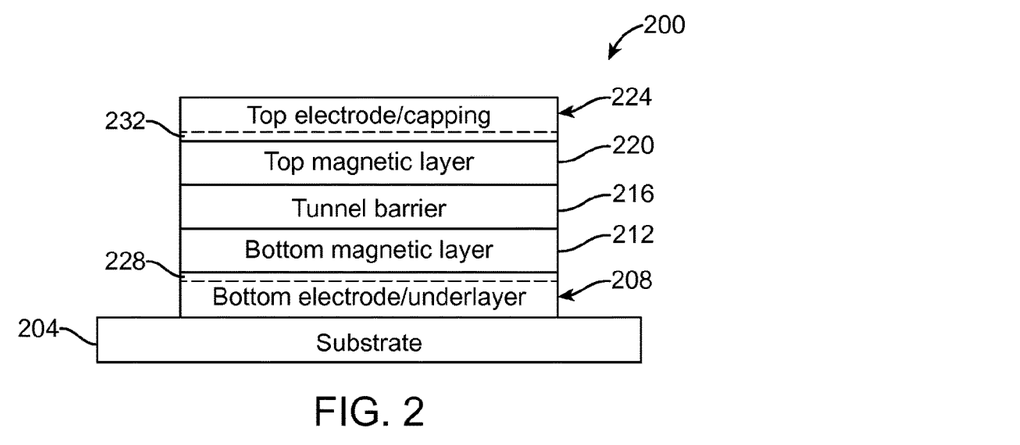
FIG. 2 is a diagram of an exemplary magnetic tunneling junction (MTJ) structure made in accordance with the present invention.

As mentioned above, an exemplary application of high-quality, high PMA τ-phase MnAl layers made in accordance with the present invention is for creating MTJs that can be used in any of a wide variety of applications, including magnetic memory (e.g., spin-transfer-torque magnetoresistive random access memory (STT-MRAM)), spintronics (e.g., magnetic logic), HDD read heads, and sensors, among others. FIG. 2 depicts an exemplary MTJ stacked-layer structure 200 as comprising a substrate 204, a bottom electrode/underlayer 208, a bottom magnetic layer 212, a tunnel barrier 216, a top magnetic layer 220, and a top electrode/capping layer 224. Substrate 204 may be any suitable substrate, such as a crystalline silicon substrate (e.g., a (100) silicon substrate) or any of the other substrates mentioned above relative to substrate 104 of FIG. 1. A silicon substrate can be desirable for its compatibility with CMOS processing techniques ubiquitous in the semiconductor industry.

Bottom electrode/underlayer 208 may be a single layer or composed of multiple sublayers. Here, too, the concept of an interface layer 228 is used to denote the layer or portion thereof interfacing with bottom magnetic layer 212. Interface layer 228 is electrically conductive so as to function as an electrode in electrical contact with bottom magnetic layer 212. Bottom electrode/underlayer 208 may comprise any one or more electrically conductive materials and may otherwise be selected and/or made in the same manner as first underlayer 108 of FIG. 1, such as in a manner that promotes the formation of high-quality, high PMA τ-phase MnAl and/or other ferromagnetic material(s) used for bottom magnetic layer 212. Tunnel barrier 216 may be any suitable electrically insulating layer. Similar to bottom electrode/underlayer 208, tunnel barrier may comprise any one or more electrically insulating materials and may otherwise be selected and/or made in the same manner as first underlayer 108 of FIG. 1 and bottom electrode/underlayer 208 of FIG. 2, such as in a manner that promotes the formation of high-quality, high PMA τ-phase MnAl and/or other ferromagnetic material(s) used for top magnetic layer 220. Top electrode/capping layer 224 may include any suitable electrically conductive material(s), such as Ta and/or TiN, among others, provided as a sublayer within the capping layer or as the entire capping layer so as to provide an interface layer 232 with top magnetic layer 220.

As those skilled in the art understand, in MTJ stacked-film structure 200 of FIG. 2 bottom electrode/underlayer 208 provides electrical contact to bottom magnetic layer 212, and top electrode/capping layer 224 provides electrical contact to top magnetic layer 220. Tunnel barrier 216 is composed of an electrically insulating material forming a film thin enough to allow tunneling of electrons from one magnetic layer to the other. One, the other, or both of bottom magnetic layer 212 and top magnetic layer 220 may include one or more high-quality, high PMA τ-phase MnAl made in accordance with aspects of the present invention, alone or in combination with one or more other ferromagnetic materials. The one of magnetic layer 212 and 220 that is more magnetically soft is termed the "free layer," and the other is termed the "reference layer." More advanced implementations may involve a multi-level cell (MLC) design, wherein one or more tunnel barrier+magnetic layer pairs (not shown) can be inserted into MTJ stacked-film structure 200, resulting in alternating tunnel barrier and magnetic layer films.

Exemplary Film-Stack Fabrication

Following are details of exemplary materials and sputtering-based deposition methods that can be used to achieve τ-MnAl thin films with high PMA, using either conductive (e.g. TiN, described below) or insulating underlayers (e.g. MgO). Importantly, the materials and methods described allow for a CMOS-compatible fabrication process. However, it is noted that these exemplary materials and deposition methods are not the only methods that can be used to achieve τ-MnAl thin films with high PMA. On the contrary, other materials, such as underlayer materials having lattice constants and or crystal structures the same as or similar to the lattice constants and crystal structures of the underlayer material particularly noted herein, may be used to achieve the quality of τ-MnAl thin films desired or needed to satisfy a particular application. Similarly, deposition processes other than sputtering, such as chemical vapor deposition, molecular beam epitaxy, and ion beam deposition, among others, may be used to achieve the quality of τ-MnAl thin films desired or needed to satisfy a particular application.

In an exemplary embodiment using sputtering, a silicon substrate underwent a 30 second buffered hydrofluoric acid (HF) clean to rid the surface of contaminants and allowed for epitaxial growth of deposited films. The substrate was then heated to 400° C., and a 10 nm layer of conductive TiN is sputter-deposited at 75 W of RF sputtering power in an Ar pressure of 10 mTorr, resulting in a sputter rate of 0.038 nm/s. Next, a 50 nm layer of MnAl was DC magnetron-sputtered at 40 W in an Ar pressure of 1 mTorr, resulting in a sputter rate of 0.617 nm/s. The substrate was then allowed to cool to room temperature, and a 5 nm Ta capping layer was sputtered at 10 W DC power in 1 mTorr of Ar pressure, resulting in a sputter rate of 0.083 nm/s. Lastly, the samples were annealed at 350° C. in a 4 kOe magnetic field oriented perpendicular to the film plane. It is important to note that the strength of the magnetic field during annealing need not necessarily be 4 kOe, as that was a limitation of the equipment the present inventors used for their experimentation.

Another exemplary embodiment of methods for fabrication of perpendicularly magnetized $L1_0$-ordered MnAl thin films used a MgO seed layer on silicon substrates. Fabrication conditions involved manipulating sputtering parameters (film thickness, DC sputtering power, in situ substrate temperature, and post-annealing temperature). The substrates used in this embodiment were natively oxidized 1-inch diameter (100) silicon wafers. All films were deposited in a high-vacuum Leybold-Heraeus Z-400 sputtering system at base pressures below $3 \times 10^{-7}$ Torr. Film stacks followed the structure Si substrate/MgO (20 nm)/MnAl (10-50)/Ta (5). First, a 20 nm MgO seed layer was RF sputtered (0.015 nm/s film growth rate, 10 mTorr Ar gas pressure) onto a Si substrate at room temperature.

Each substrate was then heated in situ to various temperatures (23 to 570° C.), which helped enhance the MgO (002) texture. Next, a 10-50 nm MnAl film was DC magnetron sputtered from a vacuum hot-pressed $Mn_{48}Al_{52}$ target onto the MgO while it was held at that same temperature at a deposition rate of 0.31-0.78 nm/s with an argon pressure of 4 mTorr. Each substrate was subsequently allowed to cool to room temperature, and a 5 nm Ta capping layer was DC magnetron sputtered at a deposition rate of 0.083 nm/s using argon pressure of 4 mTorr. The sample was annealed in a Micro Magnetics SpinTherm-1000 magnetic thermal annealing system with a base pressure under $5 \times 10^{-7}$ Torr and a fixed 4 kOe field perpendicular to the film plane at various temperatures (250-350° C.).

Experimental Results

To demonstrate the utility of the disclosed processes, exemplary embodiments as described above were tested. Calibrations for in situ substrate temperatures were performed using a Type K chromelalumel thermocouple. Texture, microstructure, and magnetic properties of the film stacks were investigated using x-ray diffraction (XRD), transmission electron microscope (TEM), alternating gradient field magnetometer (AGFM), and physical property measurement system (PPMS). Thickness-dependent order parameters S were calculated for the MnAl films from the integrated peak intensity ratios $I_{001}/I_{002}$ extracted from out-of-plane θ/2θ XRD patterns. Magnetic anisotropy constants were determined according to $K_u=H_k M_s/2$, wherein $H_k=H_s+4\pi M_s$ is the anisotropy field, $H_s$ is the hard-axis (in-plane) saturation field, and $M_s$ is the saturation magnetization.

Figure 3A:
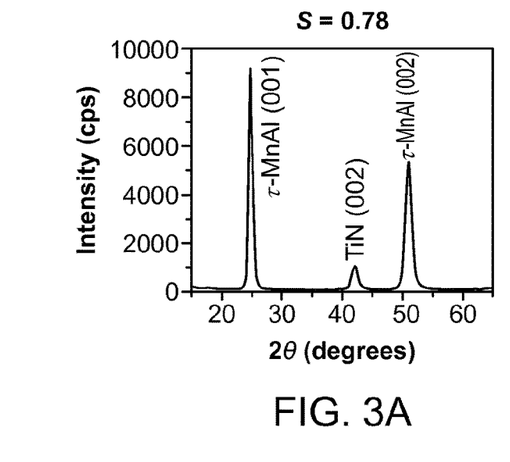
FIG. 3A is a graph illustrating out-of-plane θ/2θ X-Ray Diffraction (XRD) patterns.
Figure 3B:
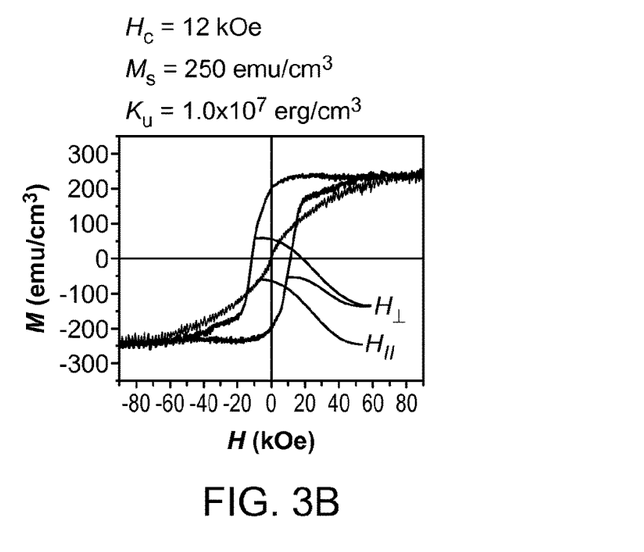
FIG. 3B is a graph of out-of-plane and in-plane magnetic hysteresis loops of Si substrate/TiN (10 nm)/MnAl (50)/Ta (5) film stack fabricated with 40 W DC power, Ts=400° C., and Ta=350° C.
Figure 4:
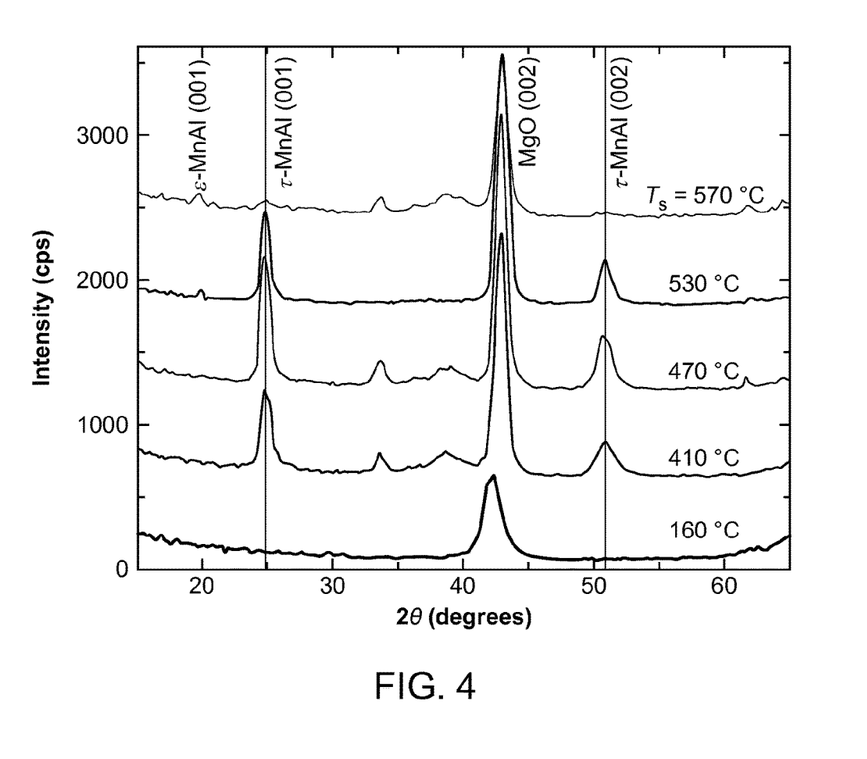
FIG. 4 is a graph illustrating out-of-plane θ/2θ XRD patterns of 30 nm MnAl films deposited at various in situ substrate temperatures.

Experimental results for an exemplar MnAl film using a conductive TiN underlayer is shown in FIGS. 3A and 3B. For films using an insulating MgO underlayer, the effects of in situ sputtering temperature ($T_s$) on formation of τ-MnAl can be seen from the θ/2θ XRD patterns shown in FIG. 4. At temperatures below 350° C., no significant τ-MnAl was observed in the films. As $T_s$ increased above 350° C., τ-MnAl began to form, reaching a maximum order parameter S of 0.98 at $T_s$=410° C. This high degree of ordering (S>0.94, rocking curve FWHM angle ~5°) was maintained for $T_s$ up to 530° C., beyond which rapid degradation of the τ-phase took place, with $T_s$=570° C. resulting in very little τ-MnAl. Instead, the nonmagnetic ε-phase became dominant.

Figure 5:
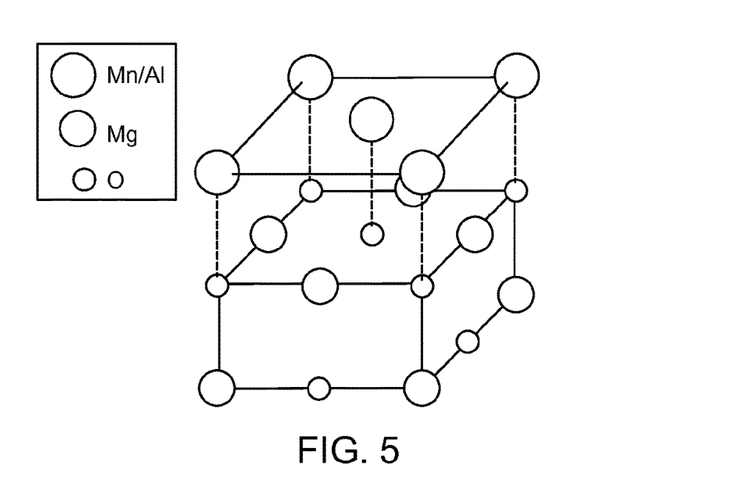
FIG. 5 is a schematic diagram illustrating the epitaxial growth relationship at an MgO/τ-MnAl interface.

The c-axis lattice constants were calculated from the out-of-plane 2θ~24.8° τ-MnAl (001) peaks as 3.58-3.59 Å for all films with significant τ-MnAl. In-plane XRD scans revealed a-axis lattice constants of 3.92-3.95 Å for τ-MnAl and 4.19-4.21 Å for MgO. Unlike previous studies, these values are very close to the reported value of c=3.57 Å and a=3.92 Å for bulk τ-MnAl. The epitaxial growth relationship between MgO and τ-MnAl is shown in FIG. 5.

Figure 6A:
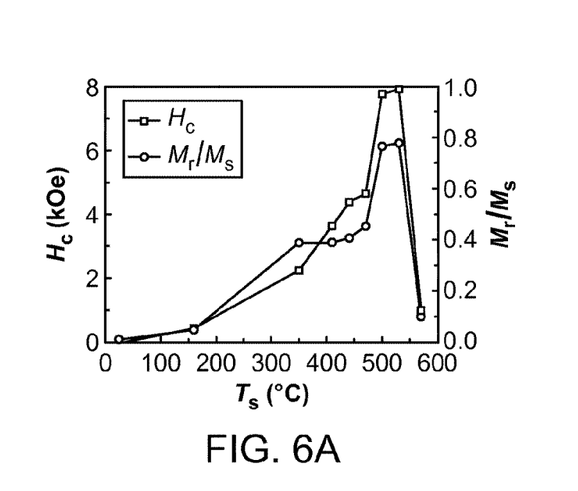
FIG. 6A is a graph illustrating the sputtering temperature dependence of out-of-plane coercivity $H_c$ and squareness $M_r/M_s$ for sample MnAl films.
Figure 6B:
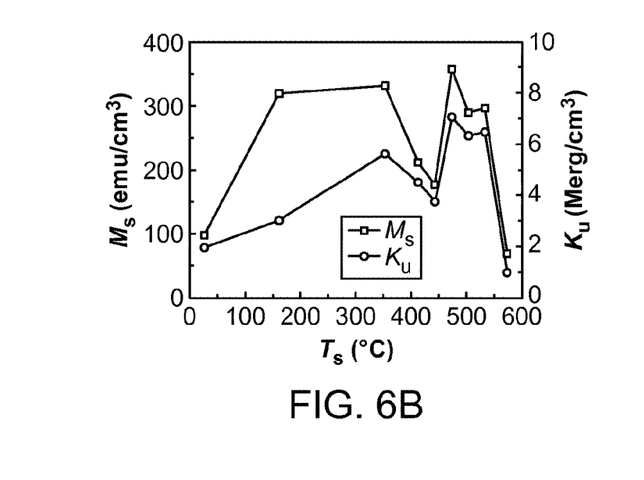
FIG. 6B is a graph illustrating the sputtering temperature dependence of saturation magnetization $M_s$ and anisotropy constant $K_u$ for sample MnAl films.

The dependence of magnetic properties coercivity ($H_c$), squareness ($M_r/M_s$), saturation magnetization ($M_s$), and anisotropy constant ($K_u$) on $T_s$ were measured and are shown in FIGS. 6A and 6B. From these data, $T_s$=530° C. appeared to produce MnAl films with the highest PMA. This substrate temperature was therefore used for further studies.

Figure 7:
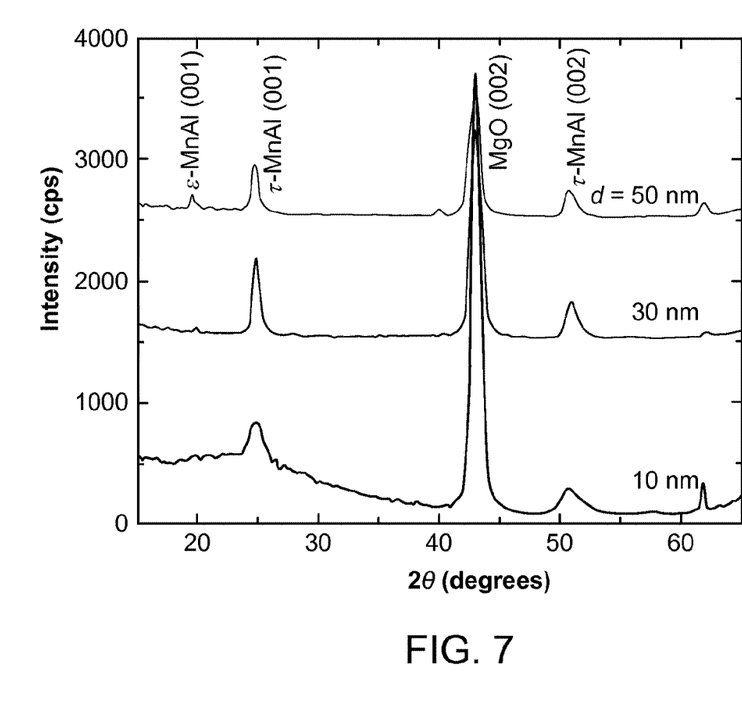
FIG. 7 is a graph illustrating out-of-plane θ/2θ XRD patterns of MnAl films with various thicknesses.

The thickness dependence of the magnetic properties and microstructure of MnAl films was also examined. From the out-of-plane θ/2θ XRD patterns shown in FIG. 7, one can see that films under 10 nm produced poor L1₀-ordering, and increasing film thickness to 50 nm produced more nonmagnetic ε-phase rather than τ-phase. The film thickness was consequently selected to be 30 nm.

Figure 8A:
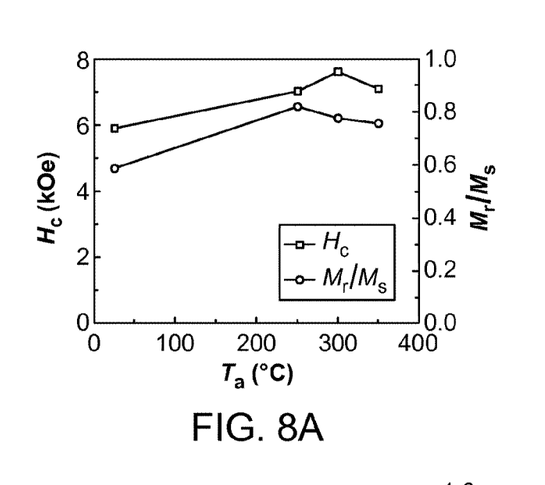
FIG. 8A is a graph illustrating DC sputtering power dependence of out-of-plane coercivity $H_c$ and squareness $M_r/M_s$ for sample MnAl films.
Figure 8B:
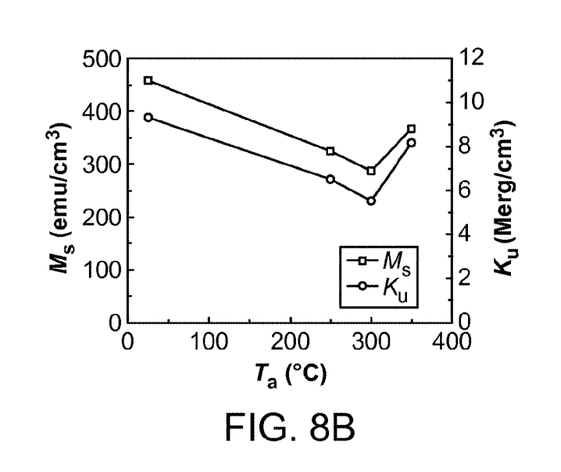
FIG. 8B is a graph illustrating DC sputtering power dependence of saturation magnetization $M_s$ and anisotropy constant $K_u$ for sample MnAl films.

The effects of DC sputtering power on magnetic properties were studied and are shown in FIGS. 8A and 8B. Films produced using DC sputtering power of 30 to 40 W demonstrated the highest perpendicular coercivity and squareness. Additionally, films deposited with DC power less than 30 W contained significant ε-phase, suggesting that low sputtering powers do not impart sufficient energy upon the Mn and Al atoms for them to order properly. Ultimately, 40 W, which deposited MnAl film at a rate of 0.63 nm/s, was chosen for further study as it produced MnAl films with high $H_c$ and moderately high $M_s$.

Figure 9A:
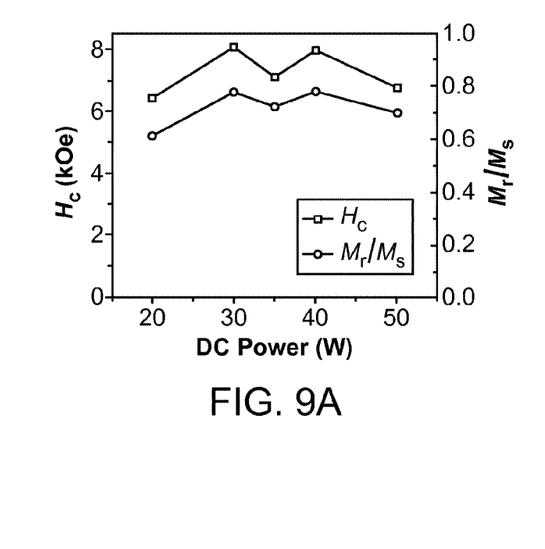
FIG. 9A is a graph illustrating magnetic annealing temperature dependence of out-of-plane coercivity $H_c$ and squareness $M_r/M_s$ for sample MnAl films.
Figure 9B:
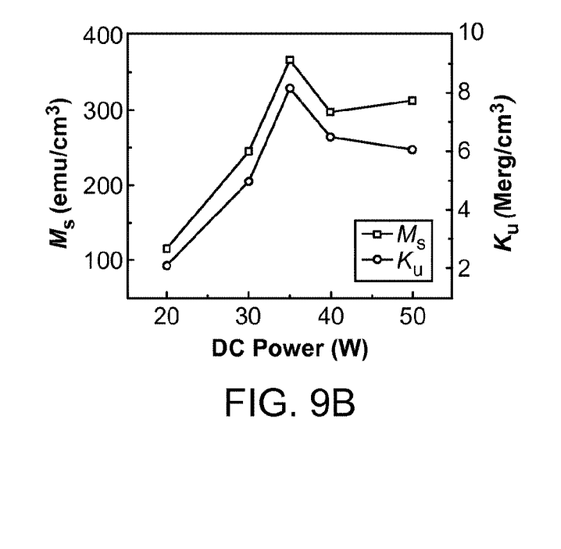
FIG. 9B is a graph illustrating magnetic annealing temperature dependence of saturation magnetization $M_s$ and anisotropy constant $K_u$ for sample MnAl films.

The impact of magnetic annealing temperature ($T_a$) was investigated and the results are plotted in FIGS. 9A and 9B. Out-of-plane magnetic properties were improved with increasing $T_a$, although $M_s$ decreased as $T_a$ was increased to 300° C. Saturation magnetization $M_s$ was partially recovered at $T_a$=350° C., which was selected as the final annealing temperature.

Figure 10A:
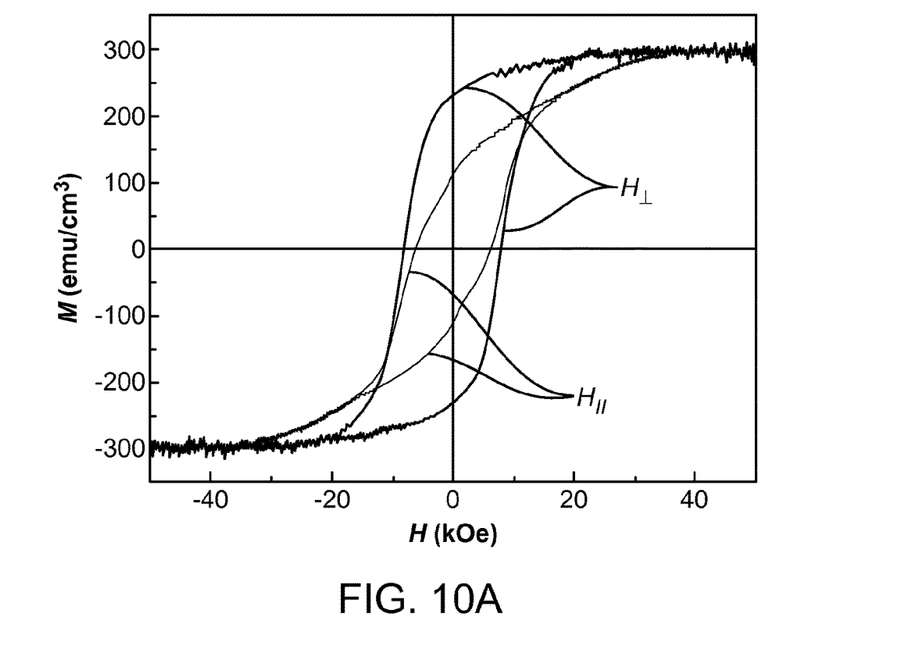
FIG. 10A is a graph illustrating out-of-plane/in-plane magnetic hysteresis loops.
Figure 10B:
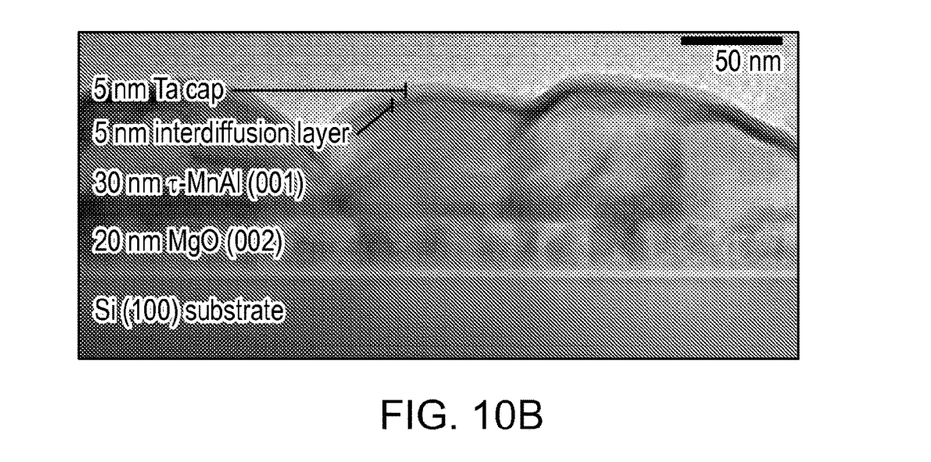
FIG. 10B is 50,000 magnification TEM cross-sectional image of the Si substrate/MgO (20 nm)/MnAl (30)/Ta (5) film stack fabricated with 40 W DC power, Ts=530° C., and Ta=350° C.

An exemplary final set of deposition conditions was thus determined to be 40 W DC sputtering power (which produced a deposition rate of 0.63 nm/s), 30 nm MnAl film thickness, in situ sputtering temperature of $T_s$=530° C., and magnetic annealing temperature of $T_a$=350° C. Using these parameters, a MnAl film was fabricated and characterized. As plotted in FIG. 10A, the film demonstrated high PMA with $H_c$ of 8 kOe, $K_u$ of 6.5×10⁶ erg/cm³, $M_s$ of 300 emu/cm³, and out-of-plane squareness $M_r/M_s$ of 0.8, with a measured film composition of $Mn_{54.0}Al_{46.0}$ and order parameter of S=0.94. The TEM cross-sectional image in FIG. 10B shows significant clumping of MnAl above the MgO (002) seed layer, suggesting the need for underlayers with reduced lattice mismatch and higher surface binding energy to improve wetting of the deposition surface. The TEM image also indicates a 5 nm region of diffusion between the MnAl and Ta cap, supporting the idea of a magnetically "dead" layer. This 5 nm region was subtracted from the effective film thickness when calculating the order parameter and saturation magnetization values.

Although aspects of the invention are illustrated and described herein with reference to specific embodiments, the invention is not intended to be limiting to the details shown. Rather, various modifications may be made in the details without departing from the invention. For example, those skilled in the art will recognize that underlayers with increased surface binding energy over those described in the exemplar embodiment herein, would improve wetting by the MnAl, thereby enabling the use of lower deposition temperatures and promoting smooth, continuous growth of L1₀-ordered τ-MnAl thin films with improved PMA on Si substrates.

Those skilled in the art will recognize that the magnetic properties of τ-MnAl thin films on Si substrates described herein, will be applicable to a variety of uses including use of MnAl-based thin films for perpendicular magnetic tunnel junctions (pMTJs), particularly for STT-RAM applications.

Exemplary Devices

Figure 11A:
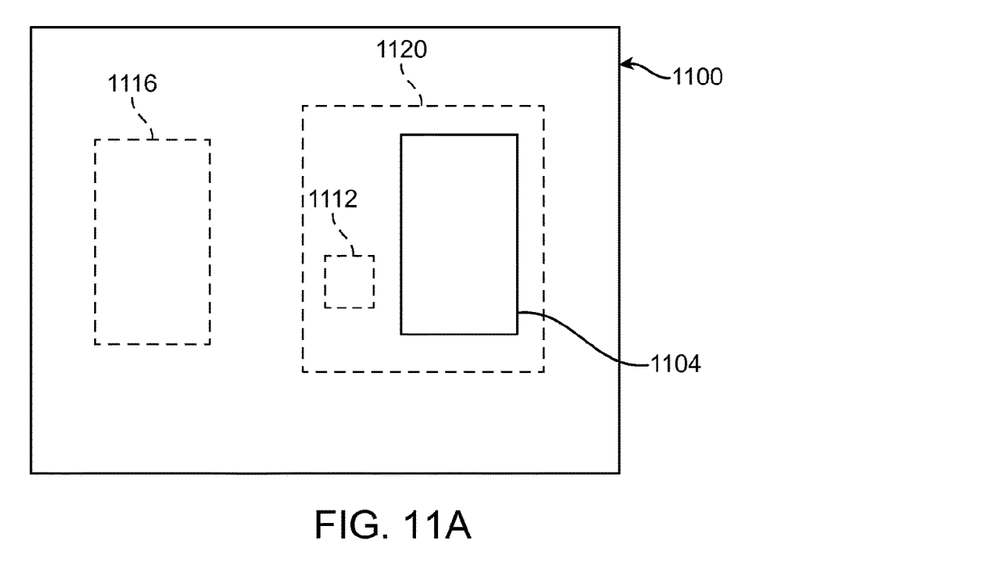
FIG. 11A is a high-level block diagram of a computing device comprising MTJ's made in accordance with aspects of the present invention.

FIG. 11A illustrates an exemplary electronic device 1100 that includes MTJ-based circuitry 1104 made in accordance with aspects of the present invention. Electronic device 1100 may be any suitable electronic device, such as a microprocessor chip, system on chip, application-specific integrated circuit, or memory chip, among others. Fundamentally, there is no limitation on the nature of electronic device 1100, only that it include one or more high-PMA τ-MnAl thin films made in accordance with aspects of the present invention. Examples of MTJ-based circuitry 1104 include, but are not limited to, STT-MRAM circuitry, such as STT-MRAM circuitry 1108 illustrated in FIG. 11B, and spintronic (magnetic logic) circuitry, among others. Regardless of the type of MTJ-based circuitry 1104, the MTJ-based circuitry includes one or more high-quality, high PMA τ-MnAl thin films made in accordance with aspects of the present invention. Indeed, in some embodiments, MTJ-based circuitry 1104 may include a stacked-film structure the same as or similar to stacked-film structure 200 of FIG. 2 or a variant thereof, such as stacked-film structure based on MLC design. Depending on the type of electronic device 1100, the electronic device may include one or more other components, including, but not limited to, one or more memory controllers 1112 and/or one or more processing cores 1116 and/or 1120, among many others. In some embodiments, MTJ-based circuitry 1108 (shown in FIG. 11B) configured as STT-MRAM may be implemented as cache memory for a processing core, such as processing core 1120, while in other embodiments, the MTJ-based circuitry configured as STT-MRAM may be implemented as mass storage for electronic device 1100 or a device offboard of device 1100, such as one or more separate microprocessor chips.

Figure 11B:
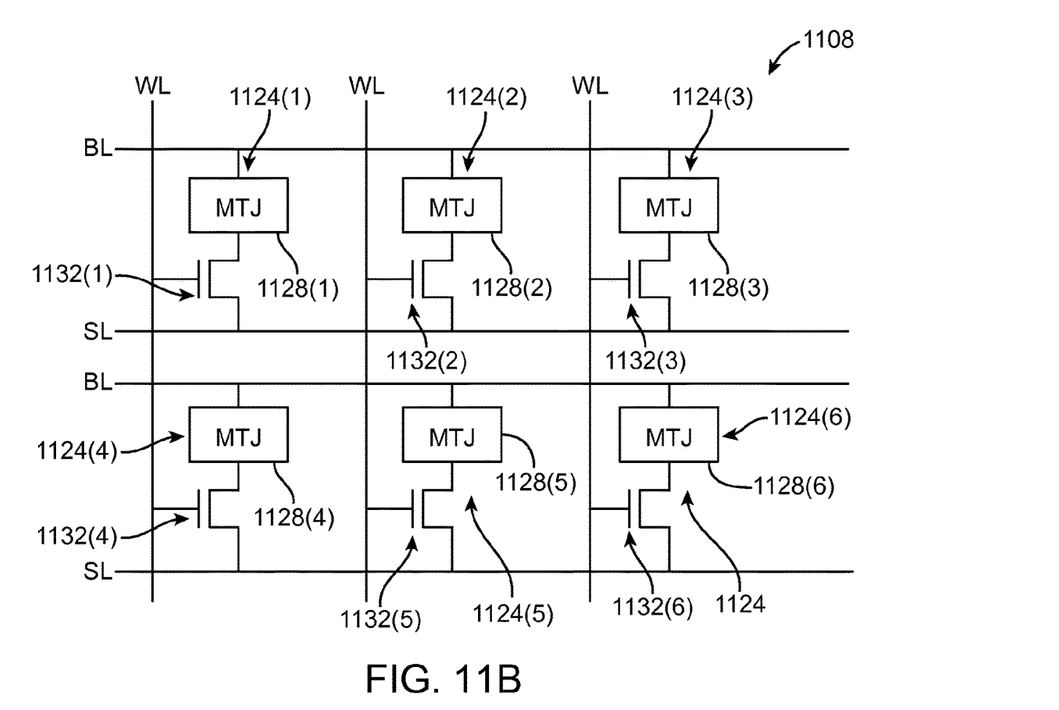
FIG. 11B is a schematic diagram of the MTJ-based circuitry of FIG. 11A configured as spin-transfer-torque magnetoresistive random access memory (STT-MRAM)

Referring to FIG. 11B, exemplary STT-MRAM 1108 includes an array 1124 of memory cells 1124(1) to 1124(6) (only six shown for convenience) in which each storage element is an MTJ 1128(1) to 1128(6), respectively. Writing of data is performed by passing a current larger than the critical switching current in either direction through the desired MTJ(s) 1128(1) to 1128(6), depending on the precise states of the magnetic layers within the MTJ(s). Reading of data is performed by passing a small current through the desired MTJ(s) 1128(1) to 1128(6), with the resulting resistance measurement indicative of whether the magnetic layers are parallel (low resistance) or antiparallel (high resistance). MLC implementations of each MTJ 1128(1) to 1128(6) would result in additional resistance states. The MTJ current in each MTJ 1128(1) to 1128(6) is controlled by a corresponding access device 1132(1) to 1132(6), which in this example is a transistor. In this case, selection of a specific memory cell 1124(1) to 1124(6) is achieved by applying appropriate voltages on the cell's corresponding word line (WL) and bit line (BL). The presence and state of a source line (SL) is dependent on the specific type of access device 1132(1) to 1132(6) used. As those skilled in the art will readily appreciate, τ-MnAl films may be used in any number of magnetic layers within the MTJ stacked-film structure (not illustrated) used to form MTJs 1128(1) to 1128(6).

Desired metrics for STT-MRAM, such as STT-MRAM 1108 of FIGS. 11A and 11B, include a Gilbert damping parameter a less than 0.01, with lower values resulting in lower critical switching current, which is desirable. Thermal stability is conventionally given as $K_u V$ (product of anisotropy and cell volume) as a multiple of thermal energy $k_B T$ (product of Boltzmann constant and operating temperature in Kelvin). A $K_u V$ in the range of 40 $k_B T$ to 60 $k_B T$ is accepted as corresponding to a 10-year retention period. Depending on the application at issue, thermal stability may be tuned accordingly. As there is a tradeoff between thermal stability and critical switching current (and therefore switching speed), some applications may sacrifice one for the other, and vice versa. Stacked-film structures containing one or more layers of τ-MnAl, such as stacked film structures 100 and 200 of FIGS. 1 and 2, respectively, may be tuned to a broad range of thermal stability, such as any $K_u V$ in a range of 10 $k_B T$ to 60 $k_B T$. Critical switching current density should be at most on the order of $10^6$ A/cm² to $10^7$ A/cm². Lower values are desirable for low-power and/or high-speed operation.

For implementations of electronic device 1100 of FIG. 11A in which MTJ-based circuitry 1104 includes magnetic logic circuitry, those skilled in the art will readily understand how to design and manufacture such circuitry. It is noted that MTJ-based circuitry 1104 can include multiple types of circuitry, such as STT-MRAM circuitry and magnetic logic circuitry. The designation of MTJ-circuitry 1104 is based simply on commonality of basic design principles rather than circuit functionality.

Figure 12:
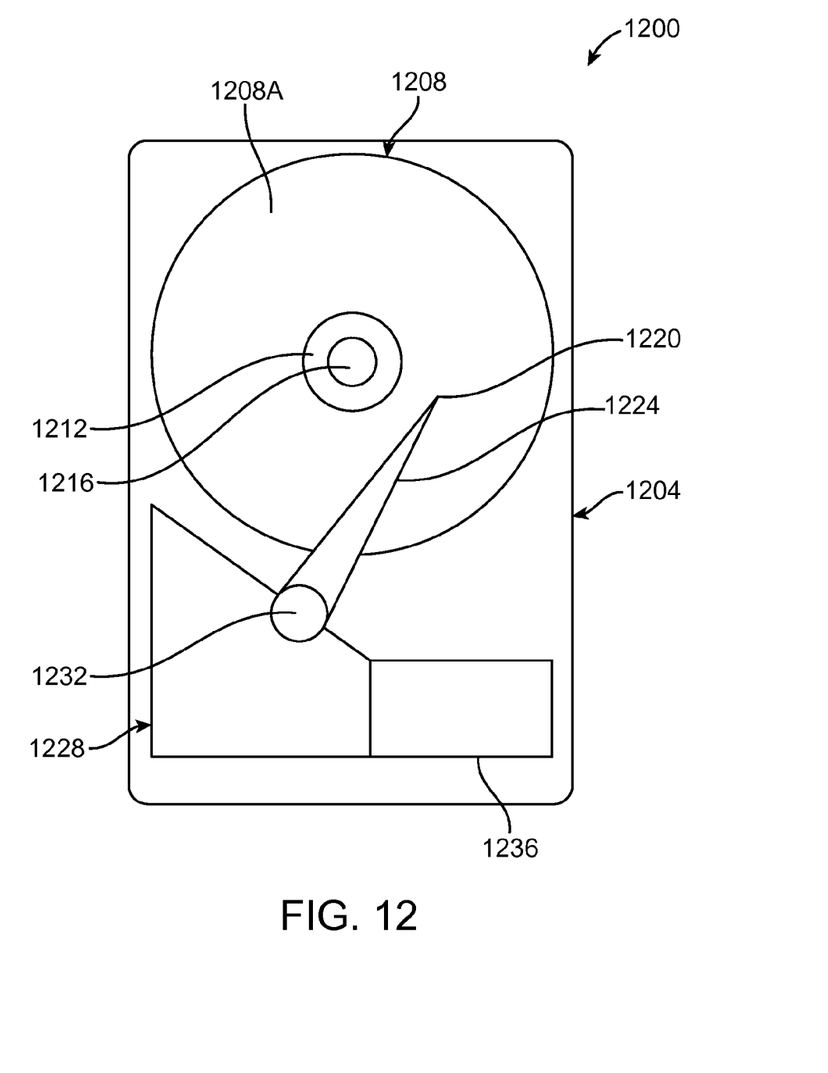
FIG. 12 is a diagram illustrating an HDD device made in accordance with aspects of the present invention.

FIG. 12 illustrates an HDD device 1200 made in accordance with aspects of the present invention so as to include one or more high-PMA τ-MnAl films. HDD device 1200 includes a chassis 1204 and one or more disk platters 1208 rotatably attached to the chassis via a spindle 1212 and driven by a spindle motor 1216. As those skilled in the art will readily understand, while one disk platter 1208 is visible in FIG. 12, one or more additional disk platters can be present on levels beneath the visible disk platter. Disk platter(s) 1208 are read by read/write heads 1220 located on an actuator arm 1224 whose movement is controlled by an actuator 1228 that may include an actuator motor 1232 or other actuator device. As those skilled in the art will readily appreciate, read-write heads 1220 may be provided in a suitable number to read and write to the obverse and reverse surfaces of each disk platter 1208. Actuation of actuator arm 1224 by actuator 1228 and other functionality of HDD device 1200, such as data flow to and from read/write heads 1220 control of spindle motor 1216, may be controlled by an onboard printed circuit board 1236. One or more high-PMA τ-MnAl films of the present disclosure may be used as part of each read/write head 1220, such as in a tunnel magnetoresistnace (TMR) based MTJ having a stacked-film structure (not shown) the same as or similar to stacked-film structure 200 of FIG. 2. Desired metrics for HDD read heads, such as read/write heads 1220, and other sensors include a moderate Gilbert damping parameter a for fast switching of free layer (optimal value depends on the specific implementation) and lower values of coercivity $H_C$ for more sensitive sensing, but which make the read heads more susceptible to picking up stray fields and therefore erroneous sensing. The optimal value for $H_C$ again depends on the specific implementation.

One or more high-PMA τ-MnAl films of the present disclosure may also or alternatively be used as part of the recording medium 1208A present on each disk platter(s) 1208. For example, each recording medium 1208A may include a stacked-film structure (not shown) the same as or similar to stacked-film structure 100 of FIG. 1. Desired metrics for HDD media, such as medium 1208, include high thermal stability and high coercivity $H_C$. For example, a $K_u V$ greater than 40 $k_B T$ is desirable and an $H_C$ of at least 6 kOe is desirable. As noted above, a $K_u V$ in the range of 40-60 $k_B T$ is accepted as corresponding to a 10-year retention period, and higher $K_u V$ values are desirable. $K_u V$ values in a range of 40 $k_B T$ to 80 $k_B T$ and $H_C$ values in a range of 6 kOe to 40 kOe may be obtained with stacked-film structures, such as stacked film structure 100 of FIG. 1, made in accordance with the present invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention. In addition, it is noted that the term "about" is used in connection with many of the values provided for metrics disclosed herein. This term should be construed according to its meaning attributed by skilled artisans in the context of its use to account for things such as accuracy of measurements and limitations of corresponding instrumentation as well as variability inherent in the parameter being measured, such as spatial variability in the parameter. Those skilled in the art will readily understand the meaning of "about" in the proper context. That said, for the sake of jurisdictions that view such language as indefinite, all occurrences of term "about" can be ignored, leaving only the definite values provided.

What is claimed is:

1. A stacked-film structure, comprising:
   a crystalline silicon substrate;
   at least one underlayer formed on the substrate; and
   an $L1_0$-ordered MnAl layer formed on the at least one underlayer, the $L1_0$-ordered MnAl layer exhibiting perpendicular magnetic anisotropy and having:
      an Mn content in a range of about 50% to about 58%;
      a thickness less than about 50 nm;
      a saturation magnetization of about 100 emu/cm$^3$ to about 600 emu/cm$^3$; and
      a magnetocrystalline anisotropy of at least $1 \times 10^6$ erg/cm$^3$;
   wherein the at least one underlayer includes an interface layer that interfaces with the $L1_0$-ordered MnAl layer, wherein the interface layer comprises at least one of an MgO layer and a TiN layer.

2. The stacked-film structure according to claim 1, wherein the thickness is less than about 10 nm.

3. The stacked-film structure according to claim 2, wherein the thickness is less than about 5 nm.

4. The stacked-film structure according to claim 1, wherein the interface layer having an a-axis lattice constant in a range of about 3.8 Å to about 4.6 Å.

5. The stacked-film structure according to claim 4, wherein the interface layer comprises a layer selected from the group consisting of a Ta layer, a Cr layer, a CrRu layer, and a $(Mg_{0.2}Ti_{0.8})O$ layer.

6. The stacked-film structure according to claim 1, wherein the Mn content is in a range of about 52% to about 56%.

7. The stacked-film structure according to claim 1, wherein the $L1_0$-ordered MnAl layer has a coercivity in a range of 6 kOe to 40 kOe.

8. A hard-disk-drive device comprising at least one platter rotatably mounted on a spindle, the at least one platter comprising a magnetic recording medium comprising the stacked-film structure according to claim 1.

9. The hard-disk-drive device according to claim 8, wherein the thickness is less than about 10 nm.

10. The hard-disk-drive device according to claim 9, wherein the thickness is less than about 5 nm.

11. The hard-disk-drive device according to claim 8, wherein the interface layer having an a-axis lattice constant in a range of about 3.8 Å to about 4.6 Å.

12. The hard-disk-drive device according to claim 11, wherein the interface layer comprises a layer selected from the group consisting of a Ta layer, a Cr layer, a CrRu layer, and a $(Mg_{0.2}Ti_{0.8})O$ layer.

13. The hard-disk-drive device according to claim 8, wherein the Mn content is in a range of about 52% to about 56%.

14. The hard-disk-drive device according to claim 8, wherein the $L1_0$-ordered MnAl layer has a coercivity in a range of 6 kOe to 40 kOe.

15. A magnetic tunneling junction (MTJ) structure, comprising:
   a crystalline silicon substrate;
   a first electrode/underlayer formed on the substrate;
   a first magnetic layer formed on the first electrode/underlayer;
   a second magnetic layer;
   a tunnel barrier formed between the first magnetic layer and the second magnetic layer; and
   a second electrode layer formed on the second magnetic layer;
   wherein as least one of the first magnetic layer and the second magnetic layer comprises an $L1_0$-ordered MnAl layer exhibiting perpendicular magnetic anisotropy and having:
      an Mn content in a range of about 50% to about 58%;
      a thickness less than about 50 nm;
      a saturation magnetization of about 100 emu/cm$^3$ to about 600 emu/cm$^3$; and
      a magnetocrystalline anisotropy of at least $1 \times 10^6$ erg/cm$^3$;
   wherein at least one of the first electrode/underlayer and the second electrode layer includes an interface layer that interfaces with the $L1_0$-ordered MnAl layer, wherein the interface layer comprises at least one of an MgO layer and a TiN layer.

16. A computing device comprising MTJ-based circuitry having the MTJ structure of claim 15.

17. The computing device according to claim 16, wherein the thickness is less than about 10 nm.

18. The computing device according to claim 17, wherein the thickness is less than about 5 nm.

19. The computing device according to claim 16, wherein the interface layer having an a-axis lattice constant in a range of about 3.8 Å to about 4.6 Å.

20. The computing device according to claim 19, wherein the interface layer comprises a layer selected from the group consisting of a Ta layer, a Cr layer, a CrRu layer, and a $(Mg_{0.2}Ti_{0.8})O$ layer.

21. The computing device according to claim 16, wherein the Mn content is in a range of about 52% to about 56%.

22. The computing device according to claim 16, wherein the $L1_0$-ordered MnAl layer has a coercivity in a range of 6 kOe to 40 kOe.

23. A solid-state memory device, comprising spin-transfer-torque (STT) memory circuitry having the MTJ structure of claim 15.

24. The solid-state memory device according to claim 23, wherein the STT memory circuitry has a Gilbert damping parameter of less than 0.01.

25. The solid-state memory device according to claim 23, wherein the STT memory circuitry has a thermal stability, $K_u V$ in a range of 10 $k_B T$ to 60 $k_B T$.

26. The solid-state memory device according to claim 25, wherein the STT memory circuitry has a thermal stability, $K_u V$ of at least 40 $k_B T$.

27. The solid-state memory device according to claim 25, wherein the STT memory circuitry has a critical switching current density of no more than $10^7$ A/cm$^2$.

28. The solid-state memory device according to claim 23, wherein the thickness is less than about 10 nm.

29. The solid-state memory device according to claim 28, wherein the thickness is less than about 5 nm.

30. The solid-state memory device according to claim 23, wherein the interface layer having an a-axis lattice constant in a range of about 3.8 Å to about 4.6 Å.

31. The solid-state memory device according to claim 30, wherein the interface layer comprises a layer selected from the group consisting of a Ta layer, a Cr layer, a CrRu layer, and a $(Mg_{0.2}Ti_{0.8})O$ layer.

32. The solid-state memory device according to claim 23, wherein the Mn content is in a range of about 52% to about 56%.

33. The solid-state memory device according to claim 23, wherein the $L1_0$-ordered MnAl layer has a coercivity in a range of 6 kOe to 40 kOe.

34. A hard-disk-drive device, comprising:
at least one platter rotatably mounted on a spindle; and
an actuator arm pivotably moved by an actuator, the actuator arm comprising at least one read/write head disposed proximate the at least one platter, the read/write head having the MTJ structure according to claim 15.

35. The hard-disk-drive device according to claim 34, wherein the thickness is less than about 10 nm.

36. The hard-disk-drive device according to claim 35, wherein the thickness is less than about 5 nm.

37. The hard-disk-drive device according to claim 34, wherein the interface layer having an a-axis lattice constant in a range of about 3.8 Å to about 4.6 Å.

38. The hard-disk-drive device according to claim 37, wherein the interface layer comprises a layer selected from the group consisting of a Ta layer, a Cr layer, a CrRu layer, and a $(Mg_{0.2}Ti_{0.8})O$ layer.

39. The hard-disk-drive device according to claim 34, wherein the Mn content is in a range of about 52% to about 56%.

40. The hard-disk-drive device according to claim 34, wherein the $L1_0$-ordered MnAl layer has a coercivity in a range of 6 kOe to 40 kOe.

41. The MTJ structure according to claim 15, wherein the thickness is less than about 10 nm.

42. The MTJ structure according to claim 41, wherein the thickness is less than about 5 nm.

43. The MTJ structure according to claim 15, wherein the interface layer having an a-axis lattice constant in a range of about 3.8 Å to about 4.6 Å.

44. The MTJ structure according to claim 43, wherein the interface layer comprises a layer selected from the group consisting of a Ta layer, a Cr layer, a CrRu layer, and a $(Mg_{0.2}Ti_{0.8})O$ layer.

45. The MTJ structure according to claim 15, wherein the Mn content is in a range of about 52% to about 56%.

46. The MTJ structure according to claim 15, wherein the $L1_0$-ordered MnAl layer has a coercivity in a range of 6 kOe to 40 kOe.

* * * * *